United States Patent [19]

Torok et al.

[11] 4,024,515

[45] May 17, 1977

[54] MAGNETO-INDUCTIVE READOUT OF CROSS-TIE WALL MEMORY SYSTEM USING BIPOLAR, ASYMMETRICAL, HARD AXIS DRIVE FIELDS AND LONG SENSE LINE

[75] Inventors: Ernest J. Torok, St. Paul; David S. Lo, Burnsville, both of Minn.

[73] Assignee: Sperry Rand Corporation, New York, N.Y.

[22] Filed: Aug. 28, 1975

[21] Appl. No.: 608,815

[52] U.S. Cl. ..................... 340/174 TF; 340/174 SR
[51] Int. Cl.² ........................................ G11C 11/02
[58] Field of Search ............... 340/174 TF, 174 HP, 340/174 SR, 174 EB, 168 S

[56] References Cited

UNITED STATES PATENTS

| | | | |
|---|---|---|---|
| 3,736,419 | 5/1973 | Almasi et al. | 340/174 TF |
| 3,868,660 | 2/1975 | Schwee | 340/174 TF |

*Primary Examiner*—Marshall M. Curtis

*Attorney, Agent, or Firm*—Kenneth T. Grace; Thomas J. Nikolai; Marshall M. Truex

[57] ABSTRACT

The method of and a configuration for reading out the information that is stored in a cross-tie wall memory system is disclosed. The apparatus utilizes: a continuously, relatively long, sense line that is aligned along and straddles the cross-tie wall; a first polarity hard axis drive field $H_{Tt}$ that passes, if in existence, a stored-1-representing-Bloch-line from a memory segment along the cross-tie wall into, along and past the continuous sense line; a second polarity hard axis drive field $H_{Tn}$ that nucleates many Bloch-lines at once along the cross-tie wall in the area of the sense line for causing the nucleating Bloch-lines to induce in the sense line an output signal that is indicative of the change in polarity of the Neel wall vectors within the cross-tie wall in the area of the sense line and, accordingly, whether or not a stored-1-representing-Bloch-line had been stored previously in the memory segment.

5 Claims, 13 Drawing Figures

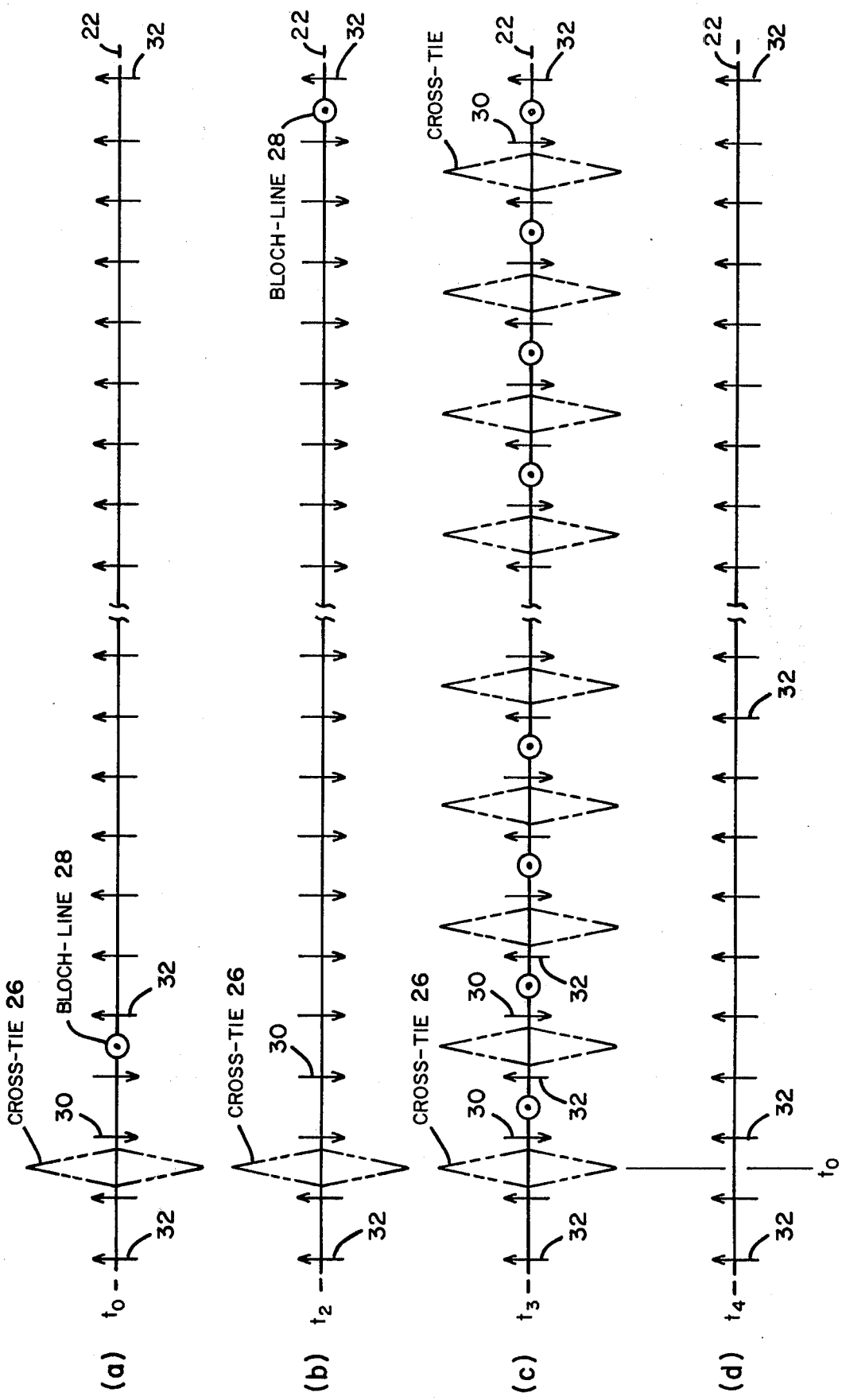

MAGNETO-INDUCTIVE READOUT OF CROSS-TIE WALL MEMORY SYSTEM USING BIPOLAR, ASYMMETRICAL, HARD AXIS DRIVE FIELDS AND LONG SENSE LINE

BACKGROUND OF THE INVENTION

The propagation of inverted Neel wall sections instead of magnetic bubbles in a serial access memory system was first proposed by L.J. Schwee in the publication "Proposal on Cross-Tie Wall and Bloch Line Propagation in Thin Magnetic Films," IEEE Transactions on Magnetics, MAG 8, No. 3, pp. 405–407, September, 1972. Such a memory system utilizes a ferromagnetic film of 81% Ni-19% Fe of approximately 300 angstroms (A) thick in which cross-tie walls can be changed to Neel walls and Neel walls can be changed to cross-tie walls by applying appropriate fields. Associated with the cross-tie wall is a section of inverted Neel wall that is bounded by a cross-tie on one end and a Bloch-line on the other end.

In such a cross-tie wall memory system, information is entered at one end of the serial access memory system by the generation of an inverted Neel wall section that is representative of a stored binary 1 and a non-inverted Neel wall section that is representative of a stored binary 0, and is moved or propagated along the cross-tie wall by the successive generation (and then the annihilation) of inverted Neel wall sections at successive memory cells along the cross-tie wall. In the D. S. Lo, et al, Pat. Application Ser. No. 495,971, filed Aug. 9, 1974, now Pat. No. 3,906,466 there is disclosed a propagation circuit for the transfer of inverted Neel wall sections at successive memory cells along the cross-tie wall. In the L. J. Schwee U.S. Pat. No. 3,868,660 and in a Naval Ordnance Laboratory Report NOLTR 73-185, L. J. Schwee et al, there have been published some recent results of the further development of cross-tie wall memory system and of detectors for the readout of the binary information that is stored therein.

SUMMARY OF THE INVENTION

The present invention is directed toward a novel method of and a configuration for reading out the information that is stored in a cross-tie wall memory system. The invention includes: aligning a continuous, relatively long, sense line along and about the cross-tie wall; coupling a first polarity hard axis drive field $H_{Tt}$ to a bit of data that is stored in a memory segment along the cross-tie wall; driving a Bloch-line that is stored in the memory segment (if in existence representing the storage of a binary 1 bit) into, along and out of the sense line thus reversing the orientation of the Neel wall vectors within the cross-tie wall in the area of the sense line by the passage of the Bloch-line therealong; coupling a second polarity hard axis drive field $H_{Tn}$ to the cross-tie wall in the area of the sense line; nucleating many cross-tie, Bloch-line pairs in the cross-tie wall in the area traversed by the Bloch-line; reversing the orientation of the Neel wall vectors within the cross-tie wall in the area of the sense line, and reading out the change of polarity sense of the Neel wall vectors within the cross-tie wall superposed the sense line as indicative of the passage, or not, of the stored-1- -representing-Block-line out of the memory segment, into, along and out of the sense line.

BRIEF DESCRIPTION OF THE DRAWINGS

FIGS. 4a, 4b, 4c, 4d are schematic representations of the vector orientations within the cross-tie wall of FIG. 1 at the noted times of FIG. 3.

DESCRIPTION OF THE PREFERRED EMBODIMENT

Figure 1:
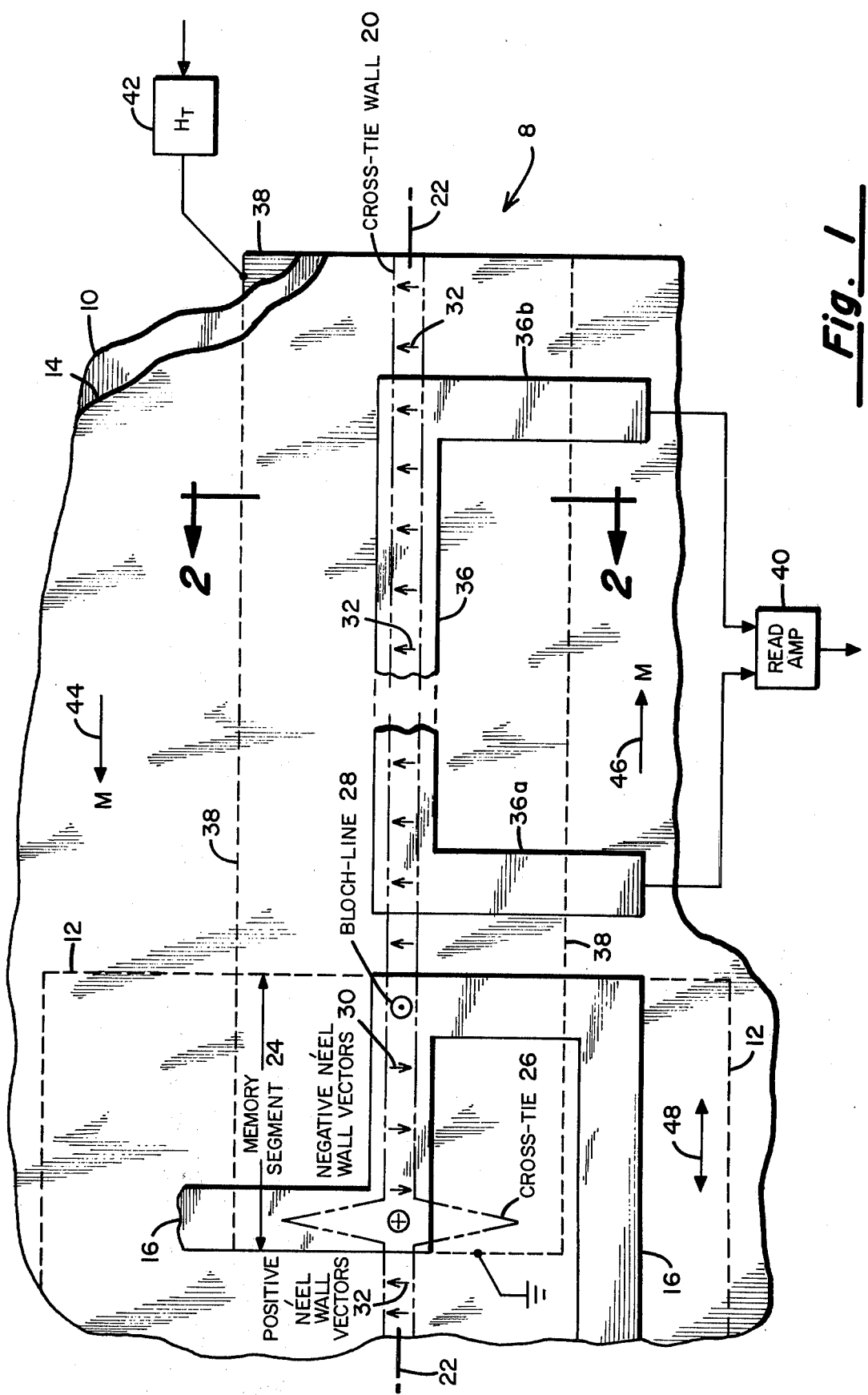
FIG. 1 is a schematic illustration of a portion of a cross-tie wall memory system, illustrating, in detail, the magneto-inductive detector of the present invention.

FIG. 1 is an illustration of a portion of a prior art cross-tie memory system into which the magneto-inductive detector 8 of the present invention is incorporated. This prior art cross-tie memory system may be similar to that of the hereinabove referenced D. S. Lo, et al, patent application and includes a non-magnetizable, e.g., glass, substrate member 10 having a copper microstrip 12 affixed to its bottom side and a thin ferromagnetic layer 14 affixed to its top side. Affixed to the top side of layer 14 and superposed the microstrip 12 is a copper drive line 16 which is affixed to and superposed to magnetic layer 14 but separated therefrom by an insulative, e.g., SiO or Mylar, member 18 — see FIG. 2. Drive line 16 consists of a plurality of serially-intercoupled portions, each of which defines a memory cell, that are over laid and are uniformly spaced along a cross-tie wall 20 oriented along a longitudinal axis 22.

In accordance with the hereinabove referenced D. S. Lo, et al, patent application, there is stored in the memory segment 24 an inverted Neel wall section, bounded by a cross-tie 26 on one end and a Bloch-line 28 on the other end, representative of the storage of a binary 1 in memory segment 24. Such inverted Neel wall section is represented by the negative Neel wall vectors 30 pointed in a downwardly direction while the remaining portion, i.e., the non-inverted Neel wall section, of the cross-tie wall is represented by the positive Neel wall vectors 32 pointed in an upwardly direction. If such representative memory segment 24 were to be redrawn for the purpose of illustrating the storage of a binary 0, the cross-tie 26, Bloch-line 28 pair illustrated in memory segment 24 would be deleted with the cross-tie wall 20 being represented by a continuation of the positive Neel wall vectors 32 throughout cross-tie wall 20 including memory segment 24.

Figure 2:
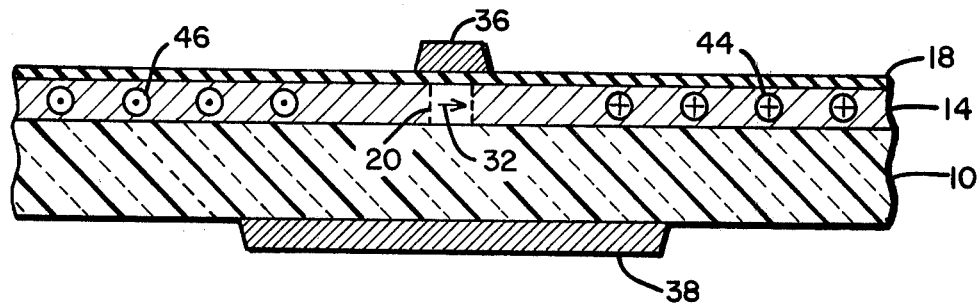
FIG. 2 is an illustration of a cross-sectional view of the detector of FIG. 1 taken along line 2—2 thereof.

With particular reference to FIG. 2 there is presented a cross-sectional view of detector 8 of FIG. 1 taken along line 2—2 thereof for the purpose of illustrating the stacked, superposed elements of FIG. 1 and the magnetic vector representations thereof. FIGS. 1, 2 illustrates that detector 8 as illustrated therein includes a non-magnetizable, e.g., glass, substrate member 10 having a thin ferromagnetic layer 14 affixed to its top side. Affixed to the top side of layer 14 but separated therefrom by an insulative, e.g., SiO or Mylar, member 18, oriented along and straddling cross-tie wall 20 is a continuous, relatively long sense line 36 having the parallel pair of members 36a, 36b extending orthogonal to the long dimension of sense line 36 and the longitudinal axis 22 of cross-tie wall 20, providing means for coupling read amplifier 40 to the otherewise open ends of sense line 36. Affixed to the bottom side of substrate member 10 and straddling cross-tie 20 is the copper drive line 38 that is utilized by detector 8 to couple to cross-tie wall 20 a hard axis drive field $H_T$. Note that layer 14 has an easy axis 48 with the magnetization M thereof above the cross-tie wall 20 being aligned in a leftward direction denoted by vector 44 and below the cross-tie wall 20 being aligned in a rightward direction denoted by vector 46.

Figure 3:
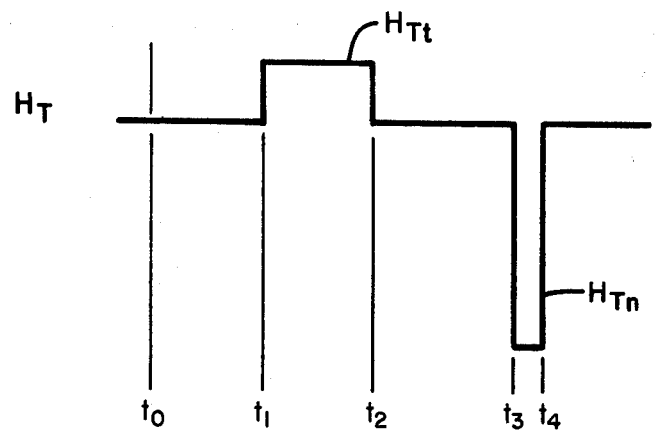
FIG. 3 is an illustration of the waveforms of a timing diagram associated with the detector of FIG. 1 for a readout operation utilizing bipolar, asymmetrical, hard axis drive fields $H_{Tt}$ and $H_{Tn}$.
Figure 5:
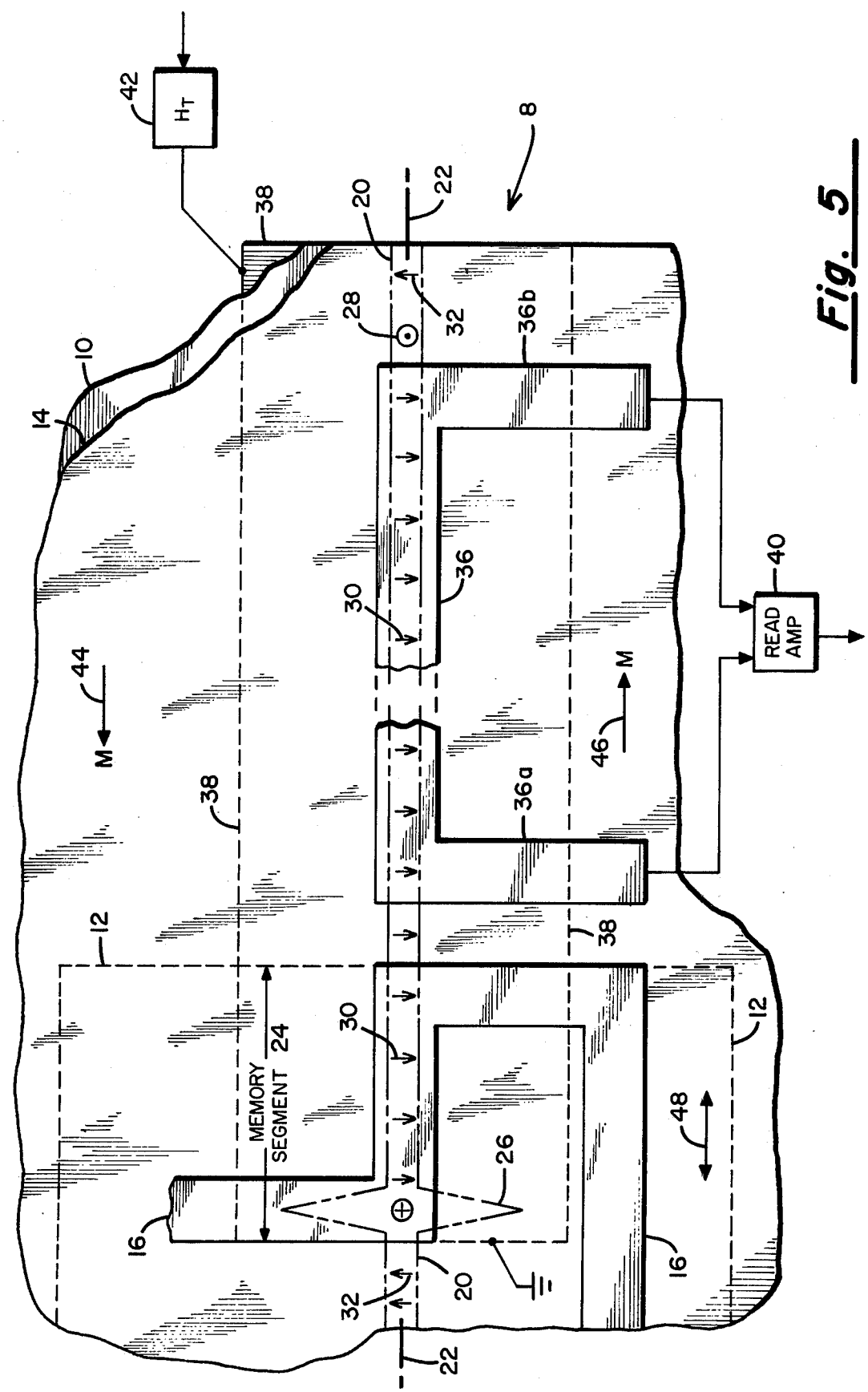
FIG. 5 is a schematic illustration of a portion of the cross-tie wall memory system of FIG. 1 illustrating the Neel wall vector orientations within the cross-tie wall after the passage of a bit-defining-Bloch-line out of the memory segment into, through and out of the continuous sense line.

With particular reference to FIG. 3 there is illustrated the waveform of a timing diagram that is associated with detector 8 of FIG. 1 for a readout operation utilizing bipolar asymmetrical, hard axis drive fields $H_{Tt}$ and $H_{Tn}$ while with particular reference to FIG. 4 there are illustrated the vector orientations within cross-tie wall 20 in the area of sense line 36 when affected by the drive fields of FIG. 3. In the method of operation of detector 8 as illustrated in FIGS. 3, 4, the storage of a cross-tie 26, Bloch-line 28 pair in memory segment 24 is assumed such that the Neel wall vector orientations at time $t_0$ are considered to be the initial condition. A hard axis drive field $H_T$ driver 42, as at time $t_1-t_2$, couples a first polarity current drive signal of the proper waveform to hard axis drive line 38 for the purpose of coupling to cross-tie wall 20, from the lefthand edge of memory segment 24 to the righthand edge of sense line 36, a downwardly directed hard axis drive field $+H_{Tt}$. This coupling of the first polarity current drive signal $+H_{Tt}$ to hard axis drive line 36 operates to move Bloch-line 28 from its original position in memory segment 24, as in FIG. 1, into, along and past sense line 36 into its new position as illustrated in FIG. 5. This passage of Bloch-line 28 from its original position in memory segment 24, at time $t_o$—see FIG. 4a—into its new position past sense line 36, at time $t_2$, reverses the orientation of the upwardly directed Neel wall vectors 32 into the orientation of a downwardly directed Neel wall vectors 30 of FIG. 4b.

Next, driver 42, as at time $t_3-t_4$, couples a second polarity current drive signal of the proper waveform to hard axis drive line 38 for the purpose of coupling to cross-tie wall 20 an upwardly directed hard axis drive field $-H_{Tn}$. This hard axis drive field $-H_{Tn}$ operates to simultaneously nucleate many cross-tie, Bloch-line pairs in cross-tie wall 20 in the area between cross-tie 26 and Bloch-line 28 — see FIG. 4c. The many simultaneously nucleating cross-tie, Bloch-line pairs in the area of sense line 36 reverses the downwardly directed Neel wall vectors 30 of FIG. 4b as at time $T_2$ into the upwardly directed Neel wall vectors 32 of FIG. 4d as at time $t_3$ while simultaneously inducing in sense line 36 a DC signal that is integrated and then outputted by read amplifier 40 as indicating that a stored-1-representing-Bloch-line was prior to the readout operation stored in memory segment 24.

In this mode of the readout operation, as illustrated in FIGS. 4a, 4b, 4c, 4d, the passage of Bloch-line 28 along cross-tie wall 20 and then its subsequent annihilation induces in sense line 36 an output signal which is indicative of the informational state of memory segment 24, i.e., whether or not memory segment 24 had stored therein a binary-1-indicating- Bloch-line 28. Note, that with memory segment 24 storing a binary 0 therein, as indicated by the absence of a Bloch- line 28, the bipolar, AC hard axis drive field $+H_{Tt}$ and $-H_{Tn}$ will have had substantially no effect upon the upwardly directed positive Neel wall vectors 32 that would then exist from the lefthand edge of memory segment 24 through to the righthand edge of sense line 36 and, accordingly, no significant readout signal would be generated by read amplifier 40.

THEORY OF OPERATION

Figure 6:
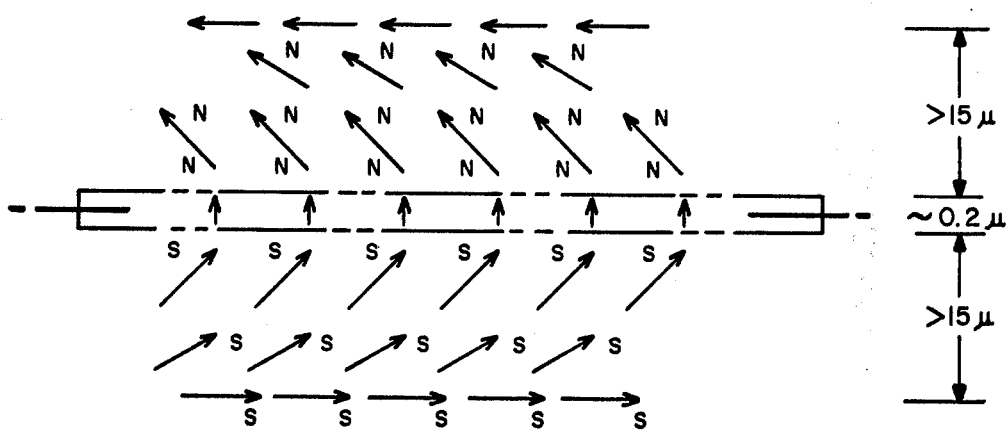
FIG. 6 is an illustration of the vector orientations within and about a 180° Neel wall.

With particular reference to FIG. 6 there is presented an illustration of the vector orientations within and about a 180° Neel wall. The Neel wall consists of a very narrow region in which the magnetization M is stongly bent, and an outer region in which the magnetization M is weakly bent. The stray fields in the two regions are of opposite polarity; in the inner region the stray field aids the bending of the magnetization M, while in the outer region, the stray field opposes the bending of the magnetization M. It is only the inner region that is observed in Bitter patterns, while the outer region can be seen with the aid of an electron microscope.

Figure 7:
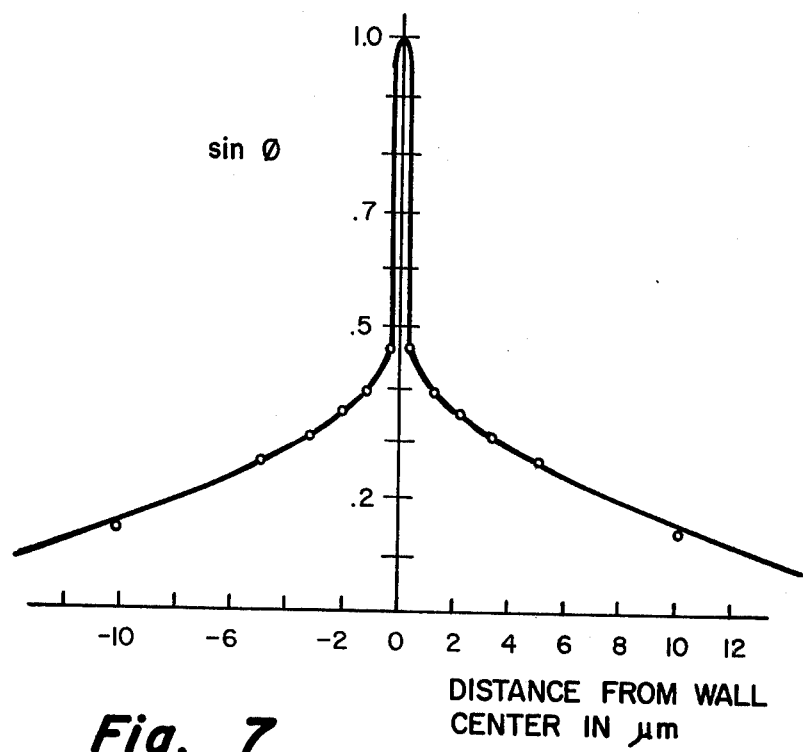
FIG. 7 is a plot of sine of angle between magnetization M orientation and the longitudinal axis of a cross-tie wall, i.e., easy axis of the film, versus distance from the cross-tie wall.

With particular reference to FIG. 7 there is illustrated a plot of sine of angle between magnetization M orientation and the longitudinal axis of a cross-tie wall versus distance from the cross-tie wall as taken by Feldtkeller of a 400 angstrom (A) NiFe film — see the publication "Kinetic Energies of the Wall in Anisotropic Nickled-Iron Layers," Manuscript submitted to Zeitschrift fuer angewante Physik; English translation available from MIT Lincoln Laboratory Library, No. AZT633GEL, 1963. The width of the interior region is calculated to be 0.2 micron ($\mu$m) wide. In the outer region, the bending of the magnetization M decays logarithmically; however, 90% of the bending of the magnetization M is completed within a region 1 mil wide. In cross-tie films, the width of the outer region is approximately the same as the length of the cross-ties, and is inversely proportional to the magnitude of the anisotrophy field $H_K$. About half the total rotation of the magnetization M occurs in the outer region, and it is this outer region that is practical to sense inductively via sense line 36.

Figure 8:
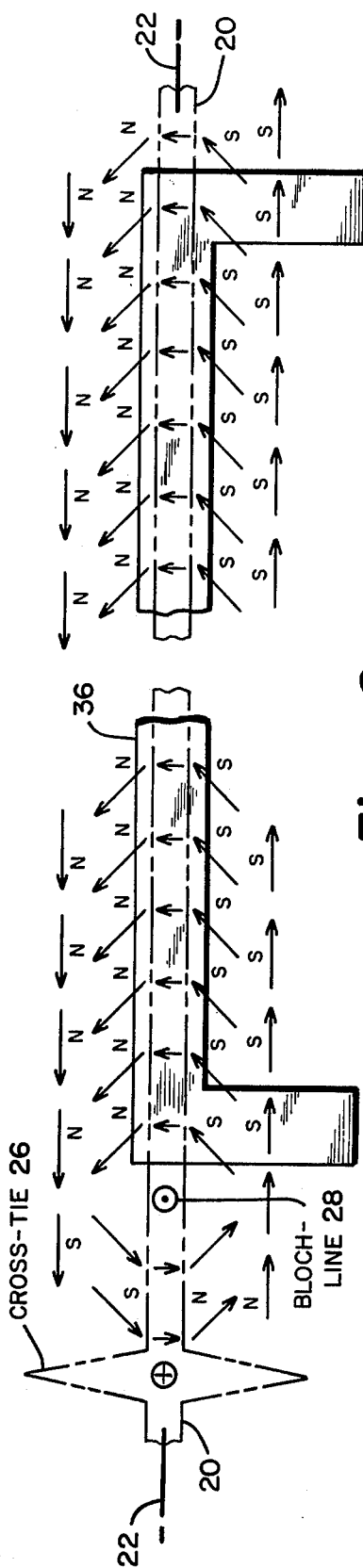
FIG. 8 is an illustration of the orientations of the magnetization M in the cross-tie wall in the area of the sense line with a Bloch-line stored in the memory segment.
Figure 9:
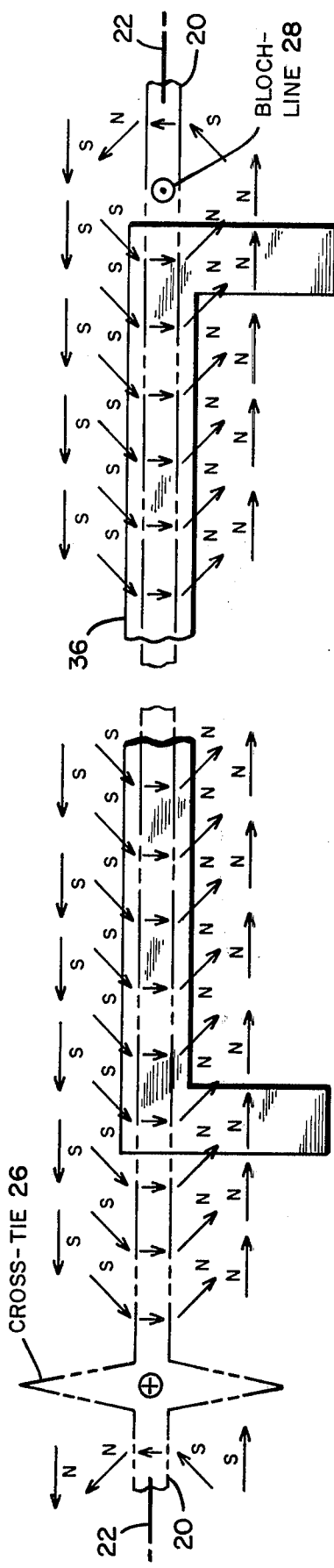
FIG. 9 is an illustration of the orientations of the magnetization M in the cross-tie wall in the area of the sense line after the Bloch-line previously stored in the memory segment has been transferred, by a hard axis drive field $H_{Tt}$ into, through and out of the sense line.

With particular reference to FIG. 8 there is presented an illustration of the orientations of the magnetization M in cross-tie wall 20 in the area of sense line 36 with the Bloch-line stored in memory segment 24 while, in contrast, with particular reference to FIG. 9 there is presented an illustration of the orientations of the magnetization M in cross-tie wall 20 in the area of line 36 after the Bloch-line 28 previously stored in memory segment 24 has been transferred, by a hard axis drive field $H_T$, into, through and out of the righthand end of sense line 36. The portions of the magnetic poles (the pole density is div $\bar{M}$) outside sense line 36 are coupled by sense line 36 while, in contrast, those within and superposed by sense line 36 are not coupled by sense line 36. If $\phi$ is the angle between the magnetization M and the easy axis 48 of the magnetic film 14, and if $x$ is the distance from the center of the cross-tie wall 20 along the hard axis direction of the magnetization M, then this pole density is $$M \; d/dx \; [\sin\phi(x)]$$

If W is the width of the sense strip-line, then $$\sin[\phi(W/2)]$$

is the fraction of the flux that is inductively coupled to sense line 36.

The polarity of Neel wall segments on opposite sides of the bloch-line 28 differ as represented by the upwardly directed positive Neel wall vectors 32 and the downwardly directed negative Neel wall vectors 30 within memory segment 24. Thus, the presence or absence of a Bloch-line can be determined by determining the polarity of a Neel wall segment within the cross-tie wall 20.

Because a Bloch-line 28 can be propagated a long distance along the cross-tie wall 20, the length of the Neel wall segment can be arbitrarily large. Thus, the polarity of the Neel wall segment can be determined by applying a hard axis drive field $+H_{Tt}$ to drive the Bloch-line 28 past sense line 36 and then applying a hard axis drive field $-H_{Tn}$ to simultaneously nucleate many cross-tie 26, Block-line 28 pairs in the area of sense line 36. If the Neel wall segment has the proper polarity, the polarity of the Neel wall reverses in direction, causing a net flux change. In contrast, if the Neel wall segment has the opposite polarity, there will be no reversal and no net flux change after the termination of the hard axis drive field $-H_{Tn}$. Although the reversal of flux could be accomplished with a low amplitude long duration hard axis drive field $-H_{Tt}$ pulse, e/g/. 1 oersted (oe), 4 microseconds ($\mu s$) via motion of a single Bloch-line, a considerably larger single amplitude can be obtained by using a high amplitude short duration hard axis drive field $-H_{Tn}$ pulse, e.g., 3 oersteds (oe) 20 nanoseconds (ns), and simultaneously nucleating many Bloch-lines at once along the Neel wall segment.

Figure 10:
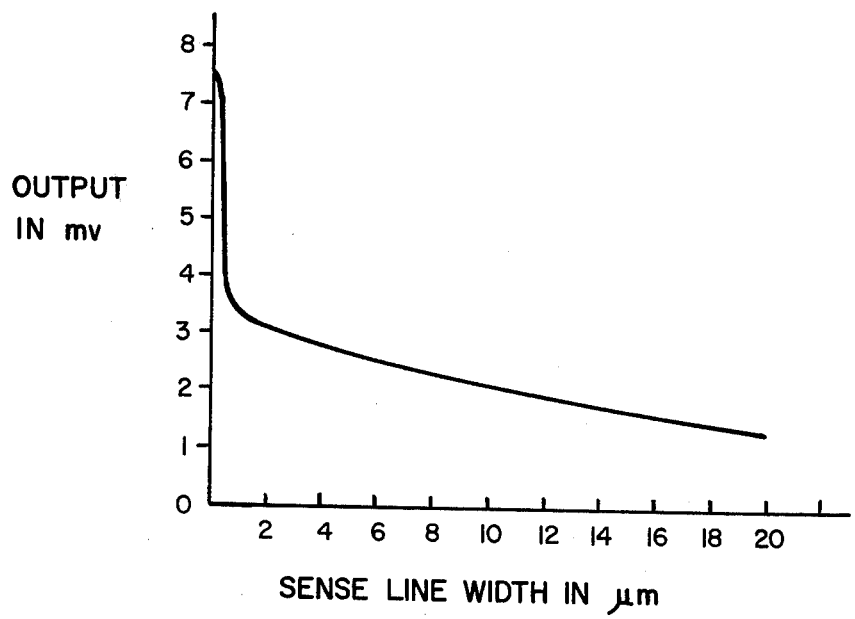
FIG. 10 is a plot of the signal induced in the sense line of FIGS. 8, 9 as calculated from the data ploted in FIG. 7.

The amplitude of the signal induced by the nucleation of the cross-tie 26, Bloch-line 28 pairs along cross-tie wall 20 in the area of sense line 36 can be calculated from the electron microscope data of FIG. 7. This data is plotted in FIG. 10 for a 300 angstrom (A) thick film 14 as a function of the width of the sense line 36. A sense line length of 85 mils, a Bloch-line mobility of 50,000 cm/oe-sec, a $4\pi M$ of 10,000 oersteds, and a hard axis drive field $H_T$ pulse amplitude of, e.g., 3 oersteds are assumed. It is also assumed that the reverse Neel wall segments will nucleate at 1 mil intervals; with this assumed mobility of 50,000 cm/oe-sec the reversal of the Neel wall segments is complete within 17 nanoseconds (nsec). The amplitude of the output signal that is plotted in FIG. 10 is the average signal over that 17 nanosecond interval. Note that from FIG. 10, in order to sense the inner region of the cross-tie wall, an extremely narrow sense line is required;

however, quite reasonable signal amplitude can be obtained by sensing the outer portion with a much wider sense line. A 9 micron ($\mu m$) wide sense line yields a signal of 2 milivolts (mv) and a 1 mil wide sense line yields more than 1 milivolt. The fact that a wide sense line may be utilized by the detector of the present invention provides an advantage in the fabrication thereof by known printed circuit techniques. One other advantage of the detector of the present invention is that the total volt-time integral of the output signal is limited only by the length of the sense line which can thus be made arbitrarily large, it being recognized that the volt-time integral is the most important quantity to establish a high signal-to-noise ratio.

What is claimed is;

1. In a cross-tie wall memory system in which binary information is stored along a cross-tie wall in a magnetic film by the presence of or absence of a section of inverted Neel wall that is bounded by a cross-tie on one end and a Bloch-line on the other end, a magneto-inductive read apparatus for the detection of binary information that is stored in the cross-tie wall system characterized by a sense line whose longitudinal axis is aligned along and superposed the longitudinal axis of the cross-tie wall and drive field means coupling first and second, opposite polarity, asymmetrical easy axis drive fields in the plane of the film, which first easy axis drive field is coupled to said inverted Neel wall section for driving only the Bloch-line of said inverted Neel wall section into and along said sense line and which second easy axis drive field is coupled to the length of the cross-tie wall that was traversed by said Bloch-line for reversing the magnetization therein and including in the sense line an output signal that indicates that the first hard axis drive field had passed, or not passed, said Bloch-line along said sense line.

2. In a cross-tie wall memory system in which bits of binary data are stored as inverted Neel wall sections which inverted Neel wall sections are bounded by a cross-tie on one end and by a Bloch-line on the other end, in a cross-tie wall in a magnetizable layer having an easy axis and in which said binary data are propagated along the longitudinal axis of said cross-tie wall, by interacting fields, a detector for magneto-inductively reading out said stored binary data, comprising:

a relatively long sense line whose longitudinal axis is aligned along the longitudinal axis of said cross-tie wall;

sense amplifier means coupled to said sense line;

drive field means coupling first and second, opposite polarity, hard axis drive fields $H_T$ to an inverted Neel wall section that is stored in said cross-tie wall for driving only the Bloch-line of said inverted Neel wall section along said cross-tie wall and into the area of said sense line and then annihilating said inverted Neel wall section said sense amplifier means sensing the passage of said Bloch-line into the area of said sense line and the annihilation of said inverted Neel wall section for indicating that said inverted Neel wall section was stored in said cross-tie wall prior to the coupling of said first and second hard axis drive fields $H_T$ thereto.

3. In a cross-tie wall memory system in which bits of binary data are stored as inverted Neel wall sections, which inverted Neel wall sections are bounded by cross-tie on one end and by a Bloch-line on the other end, in a cross-tie wall in a magnetizable layer having an easy axis and in which said binary data are serially propagated along the longitudinal axis of said cross-tie wall by the interacting fields provided by associated drive lines, which drive lines have memory segments that are associated with associated memory cells in said magnetizable layer in which associated ones of said bits in said magnetizable layer in which associated ones of said bits of binary data are stored as inverted Neel wall sections, a detector for magneto-inductively reading out said stored binary data, comprising:

a relatively long sense line whose longitudinal axis is aligned along and superposed the longitudinal axis of said cross-tie wall;

sense amplifier means coupled across the otherwise open ends of said sense line;

drive means;

coupling a hard axis drive field $H_{Tt}$, of a first polarity, to an inverted Neel wall section that is stored in one of said memory segments for driving only the Bloch-line of said inverted Neel wall section along said cross-tie wall, out of said one memory segment, under, along and out of said sense line; and then coupling a hard axis field $H_{Tn}$, of a second and opposite polarity to the first polarity of said field $H_{Tt}$, to the length of said cross-tie wall that has been traversed by said Bloch-line for nucleating many cross-tie, Bloch-line pairs along said length of the cross-tie wall and then annihilating said many cross-tie, Bloch-line pairs; said sense amplifier means generating a signal that indicates that a Bloch-line has, or has not, traversed said length of cross-tie wall for indicating that an inverted Neel wall section was, or was not, stored in said one memory segment prior to the coupling of said fields $H_{Tt}$ and $H_{Tn}$, thereto.

4. In a cross-tie wall memory in which bits of binary data are stored as inverted Neel wall sections, which inverted Neel wall sections are bounded by a cross-tie on one end and by a Bloch-line on the other end, in a cross-tie wall in a magnetizable layer having an easy axis and in which said binary data are propagated along the longitudinal axis of said cross-tie by interacting fields, a method of magneto-inductively reading out said stored binary data, comprising:

aligning a relatively long sense line with its longitudinal axis parallel to and superposed to the longitudinal axis of said cross-tie wall;

positioning an inverted Neel wall at a first end of said sense line;

coupling a first polarity hard axis drive field to said inverted Neel wall section;

driving only the Bloch-line of said inverted Neel wall section along said cross-tie wall, under said sense line from a first end, along said sense line to the second end, opposite to said first end, of said sense line;

coupling a second polarity, opposite to said first polarity, hard axis drive field to the length of said cross-tie wall that has been traversed by said Bloch-line;

reversing the polarity of the magnetization in said length of said cross-tie wall that has been traversed by said Bloch-line; and, inducing in said sense line a signal that indicates that a Bloch-line has, or has not, traversed said length of said cross-tie wall by reversing, or not reversing, the magnetization in said length of said cross-tie wall.

5. In a cross-tie wall memory system in which bits of binary data are stored as inverted Neel wall sections, which inverted Neel wall sections are bounded by a cross-tie on one end by a Bloch-line on the other end, in a cross-tie wall in a magnetizable layer having an easy axis and in which said binary data are serially propagated along the longitudinal axis of said cross-tie wall by the interacting fields provided by associated drive lines, which drive lines have memory segments that are associated with associated memory cells in said magnetizable layer in which associated ones of said bits of binary data are stored as inverted Neel wall sections, a method of magneto-inductively reading out said stored binary data, comprising:

aligning a relatively long sense line along and straddled about said cross-tie wall;

coupling a sense amplifier across the open ends of said sense line;

coupling a hard axis drive field $H_{Tt}$, of a first polarity, to an inverted Neel wall section that is stored in one of said memory segments;

driving only the Bloch-line of said inverted Neel wall section along said cross-tie wall, out of said one memory segment, into, along and out of said sense line by said field $H_{Tt}$;

coupling a hard axis drive field $H_{Tn}$, of opposite polarity to said field $H_{Tt}$, to the length of said cross-tie wall that has been traversed by said Bloch-line;

nucleating many cross-tie, Bloch-line pairs along said length of the cross-tie wall that has been traversed by said Bloch-line by said field $H_{Tn}$;

annihilating said many cross-tie, Bloch-line pairs by said field $H_Tn$;

inducing in said sense line a signal that indicates that a Bloch-line has, or has not, traversed said length of cross-tie wall;

sensing the nucleation and annihilation of said many cross-tie. Bloch-line pairs by said sense line and said sense amplifier as an indication that an inverted Neel wall section was stored in said one memory segment prior to the coupling of said fields $H_{Tt}$ and $H_{Tn}$ thereto.

* * * * *

UNITED STATES PATENT AND TRADEMARK OFFICE
CERTIFICATE OF CORRECTION

PATENT NO. : 4,024,515
DATED : May 17, 1977
INVENTOR(S) : Ernest J. Torok, et al It is certified that error appears in the above-identified patent and that said Letters Patent are hereby corrected as shown below:

Column 6, Line 33, "including" should be --inducing--.

Column 6, Line 56, after "inverted Neel wall section" insert a semicolon --;--.

Column 7, Lines 8 and 9, delete "in said magnetizable layer in which associated ones of said bits" since this is a repetition of words.

Column 7, Lines 25 through 31, "coupling a hard axis field $H_{Tn}$, of a ... cross-tie, Bloch-line pairs;" is a subparagraph and should be indented as the previous paragraph.

Column 7, Lines 31 through 37, "said sense amplifier means generating ... said fields $H_{Tt}$ and $H_{Tn}$, thereto." is a separate and main paragraph of claim 3 and should be indented as such.

Column 7, Line 38, after "memory" insert --system--.

Column 7, Line 44, "cross-tie by" should be --cross-tie wall by--.

UNITED STATES PATENT AND TRADEMARK OFFICE
CERTIFICATE OF CORRECTION

PATENT NO. : 4,024,515

DATED : May 17, 1977

INVENTOR(S) : Ernest J. Torok, et al

It is certified that error appears in the above-identified patent and that said Letters Patent are hereby corrected as shown below:

Column 8, Line 52, "cross-tie." should be --cross-tie,--.

Column 6, Line 68, before "cross-tie" insert --a--.

Column 8, Line 18, after "one end" insert --and--.

Column 8, Line 47, change "$H_T n;$" to --$H_{Tn}$;--.

Signed and Sealed this thirtieth Day of August 1977

[SEAL]

Attest:

RUTH C. MASON
Attesting Officer

C. MARSHALL DANN
Commissioner of Patents and Trademark.

UNITED STATES PATENT AND TRADEMARK OFFICE
CERTIFICATE OF CORRECTION

PATENT NO. : 4,024,515
DATED : May 17, 1977
INVENTOR(S) : Ernest J. Torok, et al It is certified that error appears in the above-identified patent and that said Letters Patent are hereby corrected as shown below:

Column 6, Line 26, "easy" should be -- hard --.

Column 6, Line 27, "easy" should be -- hard --.

Column 6, Line 31, "easy" should be -- hard --.

Signed and Sealed this

Sixteenth Day of May 1978

[SEAL]

Attest:

RUTH C. MASON
Attesting Officer

LUTRELLE F. PARKER
Acting Commissioner of Patents and Trademarks